United States Patent
Wang et al.

(10) Patent No.: US 7,187,577 B1
(45) Date of Patent: Mar. 6, 2007

(54) METHOD AND SYSTEM FOR PROVIDING CURRENT BALANCED WRITING FOR MEMORY CELLS AND MAGNETIC DEVICES

(75) Inventors: Lien-Chang Wang, Fremont, CA (US); Zhitao Diao, Fremont, CA (US); Yunfei Ding, St. Paul, MN (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/286,083

(22) Filed: Nov. 23, 2005

(51) Int. Cl.
*G11C 11/00* (2006.01)
(52) U.S. Cl. ....................... 365/158; 365/148
(58) Field of Classification Search ............... 365/158, 365/148
See application file for complete search history.

(56) References Cited

U.S. PATENT DOCUMENTS 7,102,922 B2 * 9/2006 Hidaka ................ 365/171

2002/0080644 A1 * 6/2002 Ito .......................... 365/158

OTHER PUBLICATIONS

Tetsuya Yamamoto, et al., *Magnetoresistive random access memory operation error by thermally activated reversal*, Journal of Applied Physics 97, 10P503 (2005).
John DeBrosse, *Circuit Considerations for Spin-Switched MRAM Devices*, Nanotechnology Symposium, May 14, 2004.

\* cited by examiner

*Primary Examiner*—Tuan T. Nguyen
(74) *Attorney, Agent, or Firm*—Sawyer Law Group LLP

(57) ABSTRACT

A method and system for providing a magnetic memory is included. The method and system include providing at least one magnetic storage cell and at least one dummy resistor coupled with the at least one magnetic storage cell at least for a write operation of the at least one magnetic storage cell. Each of the at least one magnetic storage cell includes a magnetic element and a selection device coupled with the magnetic element. The magnetic element being programmed by a first write current driven through the magnetic element in a first direction and a second write current driven through the magnetic element in a second direction. The selection device is configured to be coupled between the magnetic element and the at least one dummy resistor.

36 Claims, 8 Drawing Sheets

METHOD AND SYSTEM FOR PROVIDING CURRENT BALANCED WRITING FOR MEMORY CELLS AND MAGNETIC DEVICES

FIELD OF THE INVENTION

The present invention relates to magnetic memory systems, and more particularly to a method and system for providing a memory, magnetic storage cells and/or read and/or write schemes having an improved write characteristics

BACKGROUND OF THE INVENTION

FIGS. 1 and 2 depict a small portion of a conventional spin transfer based switching random access memory (magnetic RAM) 1. The conventional magnetic RAM 1 includes a conventional magnetic storage cell 10 including a magnetic element 12 and a selection device 14. Also depicted are a word line 16, a bit line 18, and source line 20. The word line 16 is oriented perpendicular to the bit line 18. The source line 20 is typically either parallel or perpendicular to the bit line 18, depending on specific architecture used for the magnetic RAM 1.

The magnetic element 12 is configured to be changeable between high and low resistance states by driving a current through the conventional magnetic element 12. The current is spin polarized when passing through the magnetic element 12 and changes the state of the magnetic element 12 by the spin transfer effect. For example, the magnetic element 12 may be a magnetic tunnel junction (MTJ) configured to be written using the spin transfer effect. Typically, this is achieved by ensuring that the magnetic element 12 has, for example, a sufficiently small cross-sectional area as well as other features desirable for switching using the spin transfer effect. When the current density is sufficiently large, the current carriers driven through the magnetic element 12 may impart sufficient torque to change the state of the magnetic element 12. When the write current is driven in one direction, the state may be changed from a low resistance state to a high resistance state. When the write current is driven in the opposite direction, the state may be changed from a high resistance state to a low resistance state. The selection device 14 is typically a transistor, such as a CMOS transistor.

FIG. 1 depicts the conventional magnetic storage cell 10 being written to a first state by the write current, $I_{W1}$, being driven in a first direction. Thus, in FIG. 1 the bit line 18 and the word line 16 are activated. The selection device 14 is turned on. The first write current is driven from the bit line 18 to the source line 20. Consequently, a high voltage, $V_{write}$, is coupled to the bit line 18 while the source line 20 is coupled to ground. The first write current thus flows through the magnetic element 12. FIG. 2 depicts the conventional magnetic element 10 being written to a second state by a second write current, $I_{W2}$, being driven in the opposite direction. The bit line 18 and the word line 16 are still activated and the selection device 14 turned on. The high voltage, $V_{write}$, is coupled to the source line 20 while the bit line 18 is coupled to ground. Thus, the second write current, $I_{W2}$, flows through the conventional magnetic element 12.

For a read operation, the bit line 18 and the word line 16 are activated. Consequently, the selection device 14 is turned on. A read current is driven through the magnetic element 12. The read current is typically less than either the first current $I_{W1}$ or the second write current $I_{W2}$.

Thus, the conventional magnetic RAM 1 utilizes a write current driven through the magnetic element 12 in order to program data to the conventional magnetic storage cell 10. Thus, the conventional magnetic RAM 1 uses a more localized phenomenon in programming the conventional magnetic element 12. Thus, unlike the a conventional MRAM that switches its state by applying magnetic fields, the conventional magnetic RAM 1 does not suffer from a half select write disturb problem.

Although the conventional magnetic RAM 1 utilizes a lower current and a more localized programming scheme, one of ordinary skill in the art will readily recognize that the conventional magnetic RAM 1 may suffer from reliability and endurance issues due to the frequent application of a high writing current through magnetic element 12. The first and second write currents, $I_{W1}$ and $I_{W2}$, respectively, may be unbalanced. One of ordinary skill in the art will readily recognize that the magnitudes of the write currents $I_{W1}$ and $I_{W2}$ are determined by the magnitude of the current that can pass between the source and drain of the selection device 14, which is typically a CMOS transistor 14. Consequently, the ensuing discussion is for a CMOS transistor 14. The magnitude of the write currents $I_{W1}$ and $I_{W2}$ thus depend upon the source-drain current, $I_{DS}$, of the CMOS transistor 14. The source-drain current of the CMOS transistor 14, $I_{DS}$, is given by:

$$I_{DS} = \beta[(V_{GS} - V_T)V_{DS} - V_{DS}^2/2] \ldots \text{ in the linear region}$$
$$I_{DS} = \beta[(V_{GS} - V_T)^2/2] \ldots \text{ in the saturated region}$$

Eq. 1

The term $V_{GS}$ is the voltage drop between the gate and the source (gate-source voltage) of the CMOS transistor 14. The, term $V_{DS}$ is the voltage drop between the drain and the source of the CMOS transistor 14. The gain factor $\beta$ is related to the geometry of the CMOS transistor 14 and thus does not change based on the direction of the write currents $I_{W1}$ and $I_{W2}$. The term $V_T$ is the threshold voltage of the CMOS transistor 14 that is determined by material and process.

The terms $V_T$, and $\beta$ depend upon the parameters of the CMOS transistor 14. Consequently, the terms $V_T$, and $\beta$ do not depend upon the direction in which the first and second write currents $I_{W1}$ and $I_{W2}$, respectively, flow. However, the gate-source voltage, $V_{GS}$, does depend upon the direction in which the write currents $I_{W1}$ and $I_{W2}$ flow. As depicted in FIGS. 1 and 2, a particular write voltage, $V_{write}$, is applied either to the conventional magnetic element 12 at the bit line 18 or at the CMOS transistor 14 by the source line 20. If the write current $I_{w1}$ is provided, the voltage $V_{write}$ is applied by the bit line 18, as shown in FIG. 1. Thus, the gate-source voltage is not reduced. Therefore, the driving current of the CMOS transistor 14, $I_{DS}$, which corresponds to the write current $I_{W1}$, is also not reduced by the magnetic element 12. In contrast, if the voltage $V_{write}$ is applied by the source line 20 at the magnetic element 12, the gate-source voltage is reduced by the voltage drop across the magnetic element 12. Stated differently, the gate-source voltage is approximately $V_{write} - V_{mag.element}$. Consequently, the driving current of the CMOS transistor 14, $I_{DS}$, which corresponds to the write current $I_{W2}$, is reduced. Thus, the first and second currents $I_{W1}$ and $I_{W2}$ are not the same. The imbalance in write currents $I_{W1}$ and $I_{W2}$ is undesirable.

The larger current $I_{W1}$ results in a higher voltage drop across the magnetic element 12. However, such a high voltage drop may be undesirable. If the voltage drop across the magnetic element 12 is sufficiently high, the voltage drop may be close to or exceed the breakdown voltage of the tunneling barrier (not explicitly shown in FIGS. 1 and 2) of the magnetic element 12. The tunneling barrier of the magnetic element 12 may be damaged or broken down. Consequently, the reliability of the conventional magnetic RAM 1 may be adversely affected.

Accordingly, what is desired is a method and system for providing and utilizing memory cells employing spin transfer based switching with a reduced possibility of inducing dielectric breakdown in the conventional magnetic element 12. The present invention addresses such a need.

BRIEF SUMMARY OF THE INVENTION

The present invention provides a method and system for providing a magnetic memory. The method and system comprise providing at least one magnetic storage cell and at least one dummy resistor coupled with the at least one magnetic storage cell at least for a write operation of the at least one magnetic storage cell. Each of the at least one magnetic storage cell includes a magnetic element and a selection device coupled with the magnetic element. The magnetic element is programmed by a first write current driven through the magnetic element in a first direction and a second write current driven through the magnetic element in a second direction. The selection device is configured to be coupled between the magnetic element and the at least one dummy resistor.

According to the method and system disclosed herein, the present invention provides a mechanism for programming and reading a magnetic memory that may provide a better balanced write current and/or a lower voltage drop across the magnetic element.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic memory. The method and system comprise providing at least one magnetic storage cell and at least one dummy resistor coupled with the at least one magnetic storage cell at least for a write operation of the at least one magnetic storage cell. Each of the at least one magnetic storage cell includes a magnetic element and a selection device coupled with the magnetic element. The magnetic element being programmed by a first write current driven through the magnetic element in a first direction and a second write current driven through the magnetic element in a second direction. The selection device is configured to be coupled between the magnetic element and the at least one dummy resistor.

The present invention is described in the context of particular magnetic memories having certain components, such magnetic storage cells having magnetic elements including particular components and particular isolation devices. One of ordinary skill in the art will readily recognize that the present invention is consistent with the use of magnetic memories having other and/or additional components. The method and system in accordance with the present invention are also described in the context of reading from, writing to, or providing a single magnetic storage cell. However, one of ordinary skill in the art will readily recognize that the method and system can be extended to read from, write to, and/or provide multiple magnetic storage cells substantially in parallel. Finally, the present invention is described in the context of certain memories. However, one of ordinary skill in the art will readily recognize that the present invention is compatible with memories and other devices not inconsistent with the present invention. Moreover, the present invention is described in the context of dummy resistor(s) used for multiple magnetic storage cells. However, in an alternate embodiment, dummy resistor(s) might be provided for individual memory cells.

Figure 1:
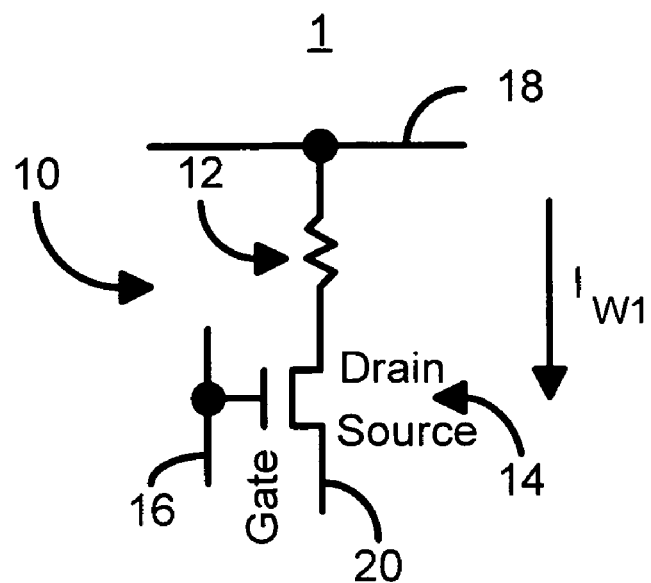
FIG. 1 is a diagram of a portion of a conventional magnetic RAM memory when a first state is written to the magnetic storage cell.
Figure 2:
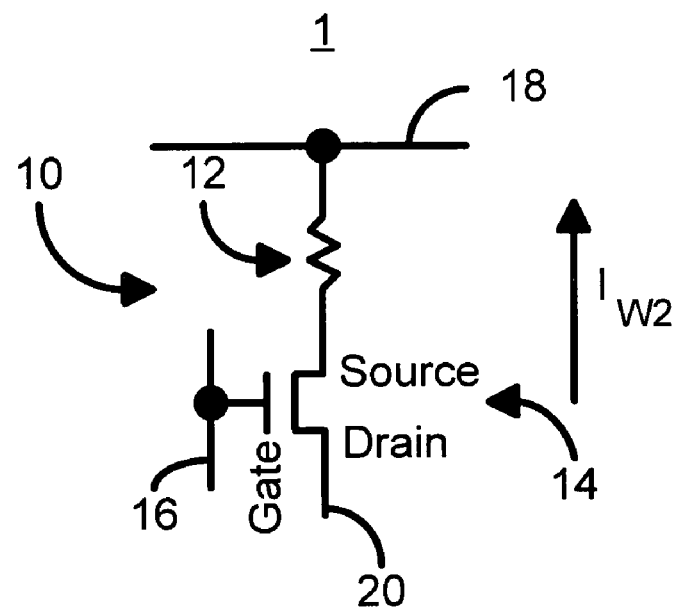
FIG. 2 is a diagram of a portion of a conventional magnetic RAM memory when a second state is written to the magnetic storage cell.
Figure 3:
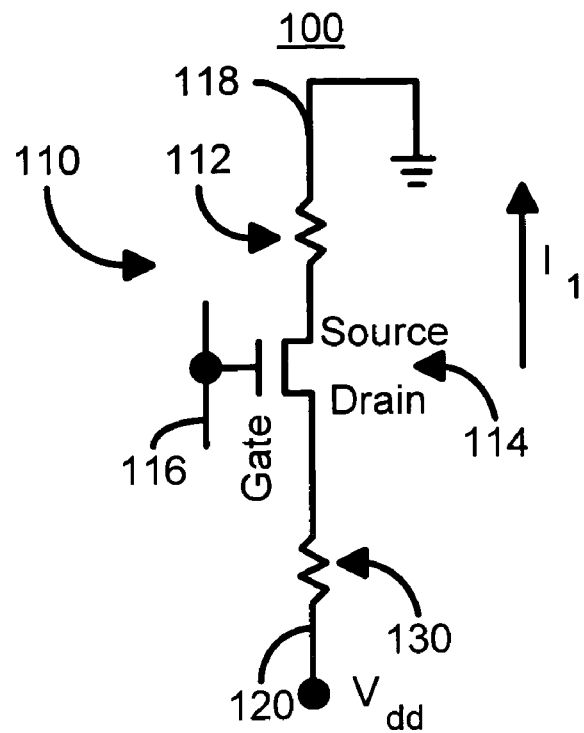
FIG. 3 is a diagram of one embodiment of a portion of a magnetic memory in accordance with the present invention utilizing spin transfer in switching.
Figure 4:
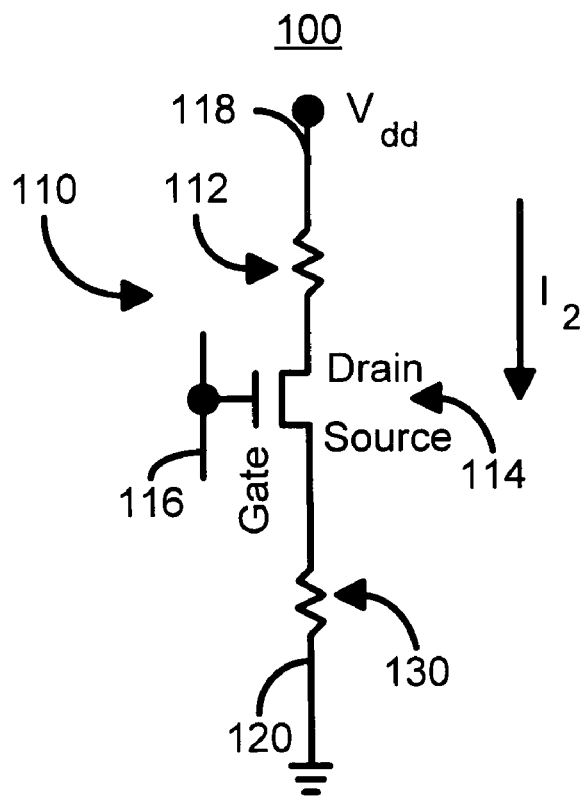
FIG. 4 is a diagram of one embodiment of a portion of a magnetic memory in accordance with the present invention utilizing spin transfer in switching.

To more particularly describe the method and system in accordance with the present invention, refer to FIGS. 3 and 4, depicting of a portion of one embodiment of a magnetic memory 100 in accordance with the present invention utilizing a single or multiple spacer magnetic element. The magnetic memory 100 includes a magnetic memory cell 110 including a magnetic element 112 capable of being programmed using spin transfer and a selection device 114. The magnetic element 112 is also read by driving a read current through the magnetic element 112. Thus, the magnetic element 112 may exhibit giant magnetoresistance. The magnetic memory 100 also includes lines 116, 118, and 120. The magnetic memory 100 also includes dummy resistor(s) 130.

The magnetic element 112 is preferably programmed to a first state using a write current, $I_1$, passed in a first direction, as depicted in FIG. 3, and programmed to a second state using a second write current, $I_2$, in a second direction, as depicted in FIG. 4. The magnetic memory 100 is, therefore, a magnetic RAM. The magnetic element 112 might include a number of layers (not shown), but preferably includes at least a magnetic pinned layer (not shown), a nonmagnetic spacer layer (not shown), and a magnetic free layer (not shown) having a magnetization that can be changed using the write currents. The nonmagnetic spacer layer is preferably a tunneling barrier layer. However, in another embodiment, the nonmagnetic spacer layer might be another layer including but not limited to be a conductive or current-confined layer. In addition, in another embodiment, the magnetic element 112 may include different and/or additional components consistent with the present invention. The selection device 114 is preferably a selection transistor 114, for example a CMOS transistor.

The dummy resistor(s) 130 are coupled with the magnetic storage cell 110 such that the selection device 114 is coupled between the dummy resistor(s) 130 and the magnetic element 112 at least for a write operation. In a preferred embodiment, the dummy resistor(s) 130 are decoupled during a read operation. However, decoupling the dummy resistor(s) 130 is not required. Furthermore, in one embodiment, the dummy resistor(s) 130 are selected to balance the write currents $I_1$ and $I_2$ used in programming the magnetic storage cell 110. Thus, the dummy resistor(s) 130 are preferably configured to have the same or similar voltage drop as the magnetic element 112. In one embodiment, the dummy resistor(s) 130 have a resistance that is fifty percent to one hundred fifty percent of the resistance of the magnetic element 112. In another embodiment, the dummy resistor(s) 130 have a resistance that is at least eighty five percent and not more than one hundred fifteen percent of the resistance of the magnetic element 112.

In order to write to the magnetic element 112, a voltage, $V_{dd}$, is provided at the magnetic element 112 or at the dummy resistor 130. Consequently, write currents $I_1$ or $I_2$ are generated respectively. If the write current $I_1$ is generated by providing a voltage $V_{dd}$ at the dummy resistor 130, as depicted in FIG. 3, a voltage drop is developed across the magnetic element 112. The source-gate voltage is reduced by this voltage drop. If the write current $I_2$ is generated by providing the voltage $V_{dd}$ at the magnetic element 112, as depicted in FIG. 4, a voltage drop is developed across the dummy resistor 130. Consequently, the source-gate voltage is reduced by this voltage drop.

In a preferred embodiment, the dummy resistor(s) 130 are configured such that the voltage drop across the dummy resistor(s) 130 in FIG. 4 is substantially the same as or similar to the voltage drop across the magnetic element 112 in FIG. 3. This is preferably accomplished by controlling the resistances of the dummy resistor(s) 130 to be substantially the same as or similar to that of the magnetic element 112. More specifically, as described above, Eq. 1 indicates that the CMOS driving current, and thus $I_1$ and $I_2$, are determined by $V_{GS}$, $V_{DS}$, $V_T$, and the gain factor β. As described above, $V_T$ depends primarily on CMOS process and materials used during the manufacturing process. In addition, the gain factor, β, is not determined by the dummy resistors 130. For the dummy resistor(s) 130 configured as described above, the $V_{GS}$ and $V_{DS}$ can be determined as follows. Assume that gate voltage $V_G = V_{dd} = V_{write}$ and that $V_{dummy}$ is the voltage drop across the dummy resistor(s) 130. When writing the magnetic element 112 using $I_1$, $V_{GS} = V_{dd} - V_{mag.element}$. Furthermore, $V_{DS} = V_{dd} - V_{mag.element} - V_{dummy}$. When writing the magnetic element 112 using $I_2$, $V_{GS} = V_{dd} - V_{dummy}$. Furthermore, $V_{DS} = V_{dd} - V_{mag.element} - V_{dummy}$. If the resistance of dummy resistor is approximately equal to the resistance of the magnetic element 112 ($R_{dummy} \sim R_{mag.element}$), the voltage drops $V_{dummy}$ is approximately equal to $V_{mag.element}$. Consequently, $V_{GS}$ would be approximately the same for either $I_1$ or $I_2$. As a result, the driving current $I_{DS}$ would be approximately the same for current driven in the first direction or the second direction through the magnetic element 112. The current $I_1$ would thus be balanced with $I_2$.

Thus, in the magnetic memory 100 the dummy resistor 130 is preferably configured such that the write currents $I_1$ and $I_2$ are approximately balanced. In simulations performed, the write currents $I_1$ and $I_2$ are well balanced for the resistances of the dummy resistor 130 being identical to the resistance of the magnetic element 112 and less than or equal to approximately 2 kΩ. The write currents $I_1$ and $I_2$ may not be balanced over the entire range of resistances because the actual resistance for balancing the write currents $I_1$ and $I_2$ depends upon the combination of dummy resistor(s) 130, the resistance of the magnetic element 112, and the differences in writing the magnetic element 112 to different states. Thus, in some embodiments, the resistance of the dummy resistor(s) 130 may range from fifty percent to one hundred fifty percent of the resistance of the magnetic element 112. In one embodiment, the resistance of the dummy resistor(s) 130 is substantially ninety percent of the resistance of the magnetic element 112. However, in other embodiments, the resistance of the dummy resistor(s) may be selected to balance the write currents $I_1$ and $I_2$ based on the driving voltage ($V_{dd}$), the resistance of the magnetic element 112, magnetoresistance ratio of the magnetic element 112 and other resistance(s) in the circuit path such as any source line transistor switch(es), any bit line transistor switch(es), any bit line(s) and any source line(s). Consequently, the use of the dummy resistor(s) 130 may balance the write currents $I_1$ and $I_2$.

In other embodiments, the resistance of dummy resistor(s) 130 could be selected to provide other features. For example, the dummy resistor(s) 130 could be configured so that the current $I_1$ and $I_2$ are not balanced but instead have another specific ratio. In such embodiments, the critical current for writing high and low states is not identical. This difference is more pronounced when the magnetic element has higher polarization factor. A specific current ratio between writing various data states may aid in achieving a maximum operation window from read disturb.

Moreover, because of the addition of the dummy resistor(s) 130, the voltage drop across the magnetic element 112 when writing using the second write current $I_2$, is reduced compared to the conventional magnetic RAM 1. Because of the lower voltage drop across the magnetic element 112, there is a lower probability that a tunneling barrier in the magnetic element 112 would be damaged or suffer breakdown during writing. Consequently, the reliability and endurance of the magnetic memory 100 may be improved.

Thus, the write currents $I_1$ and $I_2$ may be balanced. In addition, damage to the magnetic element 112 may be reduced or eliminated. Moreover, this may be achieved without increasing the area of a magnetic storage cell 110. The dummy resistor(s) 130 are also preferably capable of being decoupled from the magnetic storage cell 110, for example during a read operation. Thus, the use of the dummy resistor(s) 130 may not affect the read operation.

Figure 5:
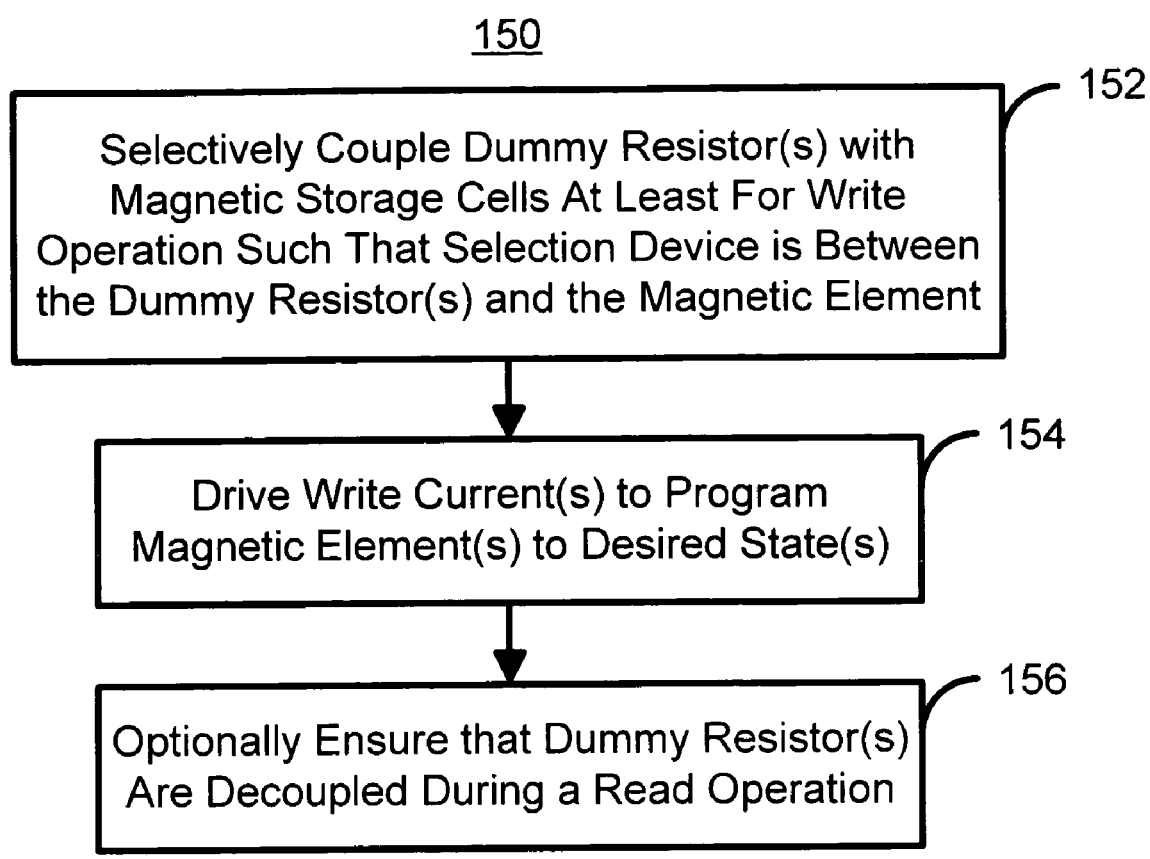
FIG. 5 is a flow-chart depicting one embodiment of a method for using a magnetic memory in accordance with the present invention.

FIG. 5 is a flow-chart depicting one embodiment of a method 150 for using a magnetic memory in accordance with the present invention. The method 150 is described in the context of the magnetic memory 100. However, the method 100 may be used with another, analogous magnetic memory. The dummy resistor(s) 130 are selectively coupled the plurality of magnetic storage cell 110 at least for a write operation, via step 152. In one embodiment, the dummy resistor(s) 130 are coupled to the magnetic storage cell 110 through source line(s) or bit line(s), depending on the state to which the magnetic element 112 is written. The dummy resistor(s) 130 are coupled in step 152 such that the selection device 114 resides between the magnetic element 112 and the dummy resistor(s). With the resistor(s) 130 coupled to the magnetic storage cell 110, the first write current $I_1$ or the second write current $I_2$ is driven through the magnetic storage cell 110 in the first or second direction, respectively, via step 154. Consequently, the dummy resistor(s) 130 are coupled to the magnetic storage cell 110 during a write operation. It is optionally ensured that the dummy resistor(s) 130 are electrically decoupled from the magnetic storage cell 110 during reading, via step 156. Thus, the dummy resistor(s) 130 may be coupled to the magnetic storage cell 110 during writing and decoupled during reading.

Using the method 150, the magnetic memory 100 may be utilized. The write currents $I_1$ and $I_2$ may also be better balanced using the method 100. Moreover, the method 100 may allow the magnetic storage cell to have improved reliability and endurance. Moreover, use of the dummy resistor(s) 130 may not affect the read operation.

Figure 6:
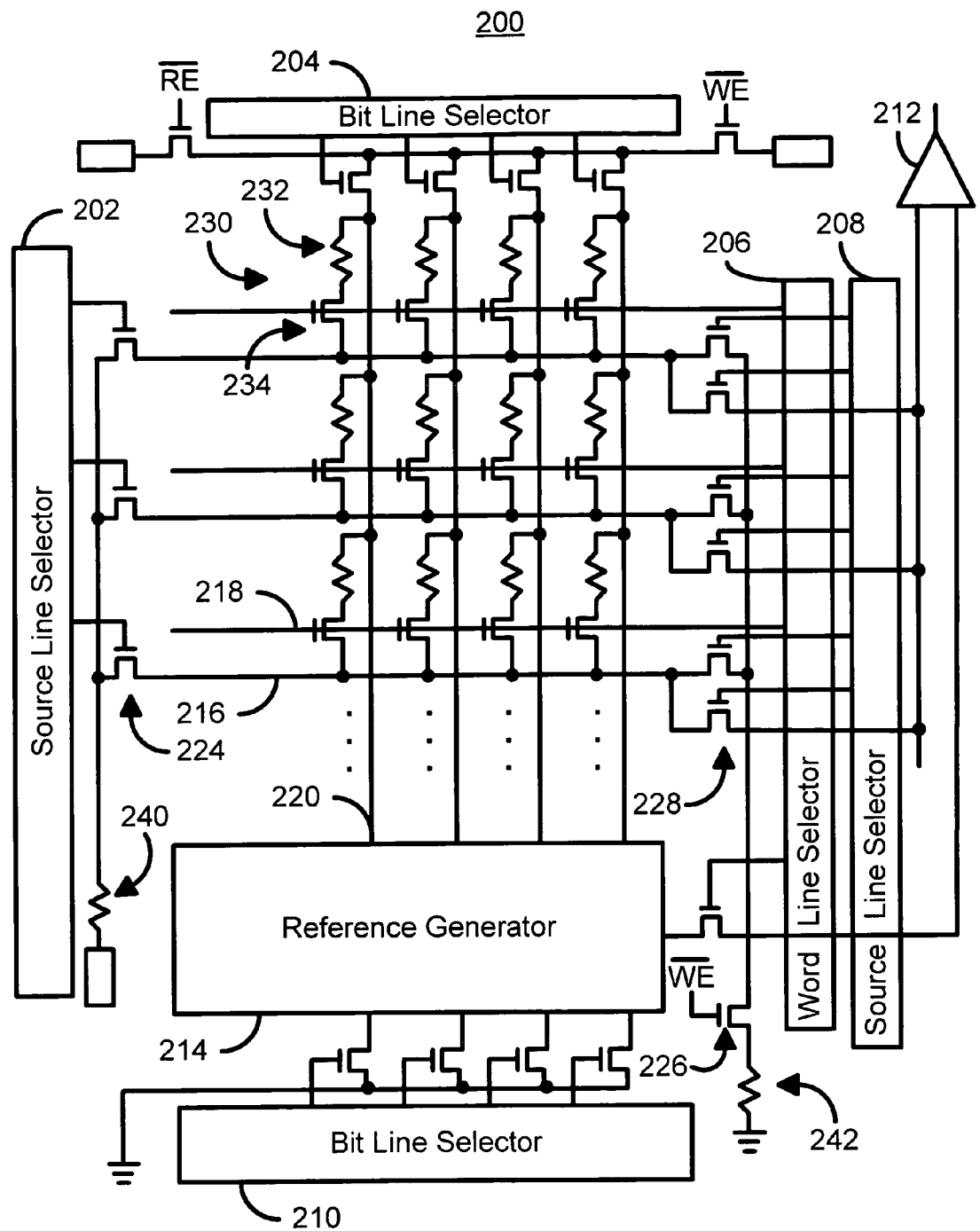
FIG. 6 is a diagram of one embodiment of a portion of a magnetic memory in accordance with the present invention utilizing spin transfer in switching and having perpendicular source lines and bit lines.

FIG. 6 is a diagram of one embodiment of a portion of a magnetic memory 200 in accordance with the present invention utilizing spin transfer in switching and having perpendicular source lines and bit lines. The magnetic memory 200 includes magnetic storage cells 230 having a magnetic element 232 and a selection device 234. In a preferred embodiment, the storage cells 230 and components 232 and 234 correspond to the storage cell 110 and components 112 and 114 depicted in FIGS. 3–4. Referring back to FIG. 6, the memory 200 is thus preferably a magnetic RAM. The memory 200 also includes source line selectors 202 and 208, bit line selectors 204 and 210, word line selector 206, bit lines 220, reference generator 214, source lines 216, word lines 218, switches 224 and 226 that are preferably transistors, and output amplifier 212. The magnetic memory 200 also includes dummy resistors 240 and 242 and circuitry 238. The bit lines 220 are perpendicular to the source lines 216 and, in the embodiment shown, the word lines 218.

For a write operation, the word lines 218 corresponding to the desired cells are activated. The magnetic elements 232 are written by a current driven from the corresponding bit lines 220 to the corresponding source lines 216, or vice versa. If current is driven from the bit lines 220 to the source lines 216, the bit lines 220 is coupled with a write voltage while the source liens 216 are coupled to ground through the dummy resistor(s) 242. If current is driven from the source lines 216 to the bit lines 220, the source lines 216 are coupled with a write voltage through the dummy resistor 240 and the bit lines 220 are coupled to ground. Consequently, the write currents are preferably balanced using the dummy resistors 240 and 242. During a read operation, the circuitry 228 may be used to selectively decouple the dummy resistors 240 and 242 from the magnetic storage cells 230 during a read operation. In addition, the circuitry 228 might include other components (not shown) used to bypass the dummy resistors 240 and 242 for other purposes. Thus, the read current may travel through the bit lines 220 through the magnetic storage cells 230 and to the output amplifier 212.

Thus, the magnetic memory 200 may share the benefits of the magnetic memory 100. In particular, the write currents $I_1$ and $I_2$ may be better balanced. The magnetic storage cells 230 may also have improved reliability and endurance. Moreover, use of the dummy resistor(s) 240 and 242 may not affect the read operation. Consequently, performance of the magnetic memory 200 may be improved.

Figure 7:
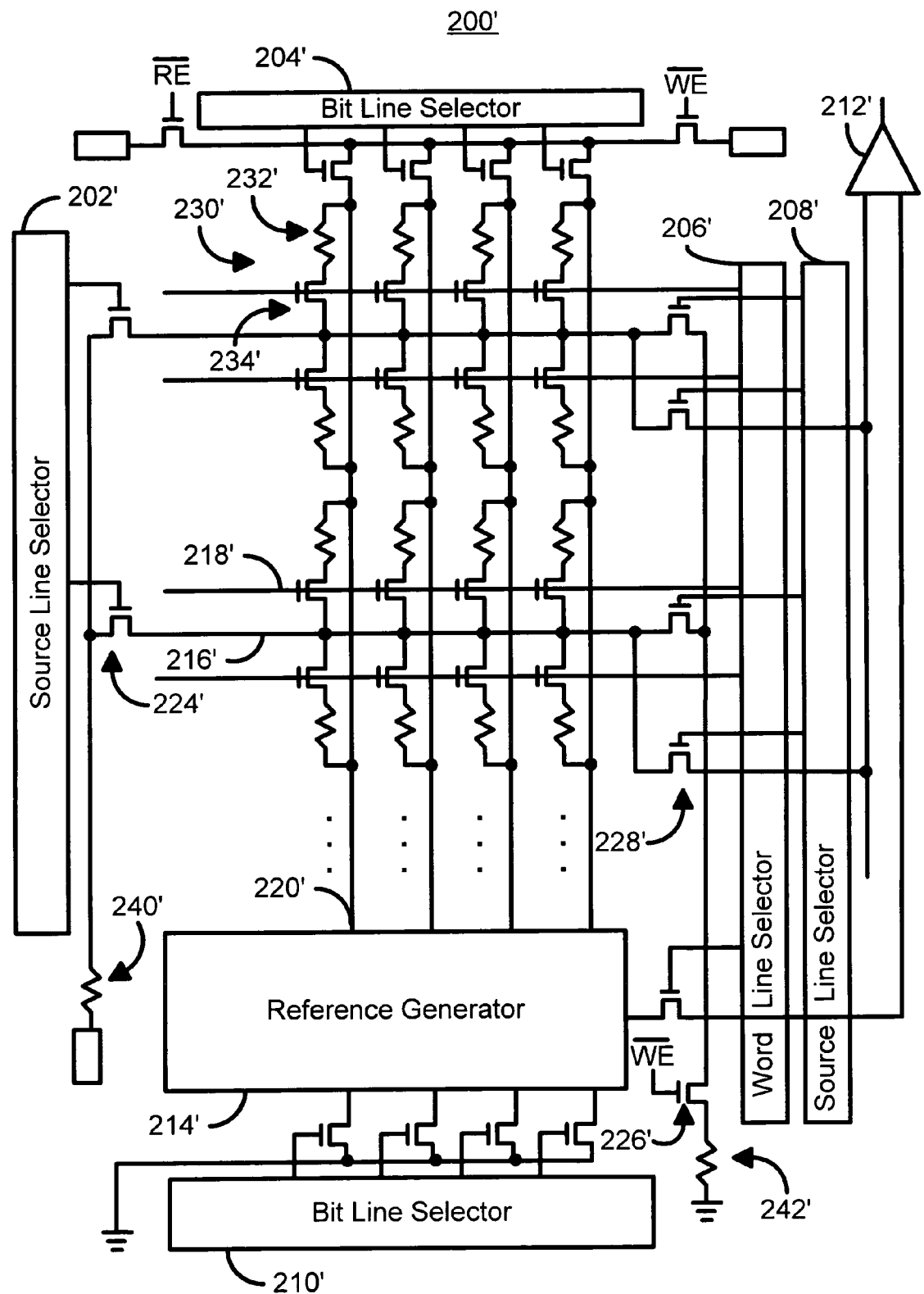
FIG. 7 is a diagram of another embodiment of a portion of a magnetic memory in accordance with the present invention utilizing spin transfer in switching and having perpendicular source lines and bit lines.

FIG. 7 is a diagram of another embodiment of a portion of a magnetic memory 200' in accordance with the present invention utilizing spin transfer in switching and having perpendicular source lines and bit lines. The magnetic memory 200' is analogous to the magnetic memory 200. Consequently, analogous components are labeled similarly. Thus, the magnetic memory 200' includes magnetic storage cells 230' having a magnetic element 232' and a selection device 234', source line selectors 202' and 208', bit line selectors 204' and 210', word line selector 206', bit lines 220', reference generator 214', shared source lines 216', word lines 218', switches 224' and 226' that are preferably transistors, output amplifier 212', dummy resistors 240' and 242', and circuitry 228'. Note that in the magnetic memory 200', the source lines 216' are shared between two magnetic storage cells 230'.

The magnetic memory 200' is thus analogous to the magnetic memory 200, except that the source lines 216' are shared by two memory cells. Operation of the magnetic memory 200' is analogous to the magnetic memory 200. Thus, the magnetic memory 200' may have better balanced write currents $I_1$ and $I_2$. The magnetic storage cells 230' may also have improved reliability and endurance. Moreover, use of the dummy resistor(s) 240' and 242' may not affect the read operation. Consequently, performance of the magnetic memory 200' may be improved.

Figure 8:
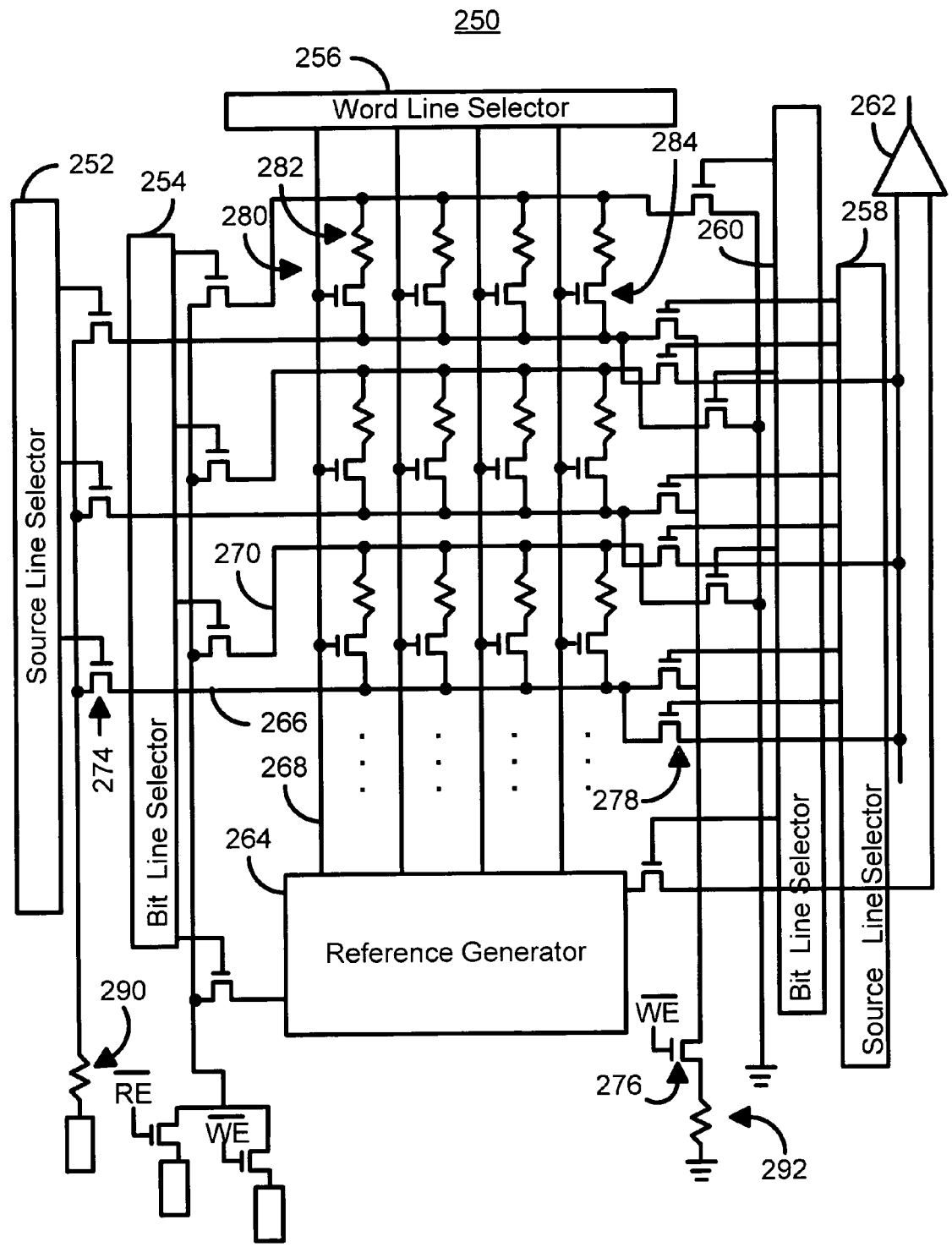
FIG. 8 is a diagram of one embodiment of a portion of a magnetic memory in accordance with the present invention utilizing spin transfer in switching and having parallel source lines and bit lines.

FIG. 8 is a diagram of one embodiment of a portion of a magnetic memory 250 in accordance with the present invention utilizing spin transfer in switching and having parallel source lines and bit lines. The magnetic memory 250 includes magnetic storage cells 280 having a magnetic element 282 and a selection device 284. In a preferred embodiment, the storage cells 280 and components 282 and 284 correspond to the storage cells 110/230/230' and components 112/232/232' and 114/234/234' depicted in FIGS. 3–7. Referring back to FIG. 8, the memory 250 is thus preferably a magnetic RAM. The memory 250 also includes source line selectors 252 and 258, bit line selectors 254 and 260, word line selector 256, bit lines 270, reference generator 264, source lines 266, word lines 268, switches 274 and 276 that are preferably transistors, and output amplifier 262. The magnetic memory 250 also includes dummy resistors 290 and 292 and circuitry 278. The bit lines 270 are parallel to the source lines 266 and, in the embodiment shown, the word lines 268.

For a write operation, the word lines 268 corresponding to the desired cells are activated. The magnetic elements 282 are written by a current driven from the corresponding bit lines 270 to the corresponding source lines 266, or vice versa. If the current is driven from the bit lines 270 to the source lines 266, the bit lines 270 are coupled with a write voltage while the source lines 266 are coupled to ground through the dummy resistor 292. If the current is driven from the source lines 266 to the bit lines 270, the source lines 266 are coupled with the write voltage through the dummy resistor(s) 290 and the bit line 270 is coupled with ground.

Consequently, the write currents may be balanced using the dummy resistors 290 and 292. During a read operation, the circuitry 278 may be used to selectively decouple the dummy resistors 290 and 292 from the magnetic storage cells 280 during a read operation. Thus, the read current may travel through the bit lines 270 through the magnetic storage cells 280 and to the output amplifier 262. In addition, the circuitry 278 might include other components (not shown) used to bypass the dummy resistors 290 and 292 for other purposes.

Thus, the magnetic memory 250 may share the benefits of the magnetic memory 100 or 200. In particular, the write currents may be better balanced. The magnetic storage cells 260 may also have improved reliability and endurance. Moreover, use of the dummy resistor(s) 290 and 292 may not affect the read operation. Consequently, performance of the magnetic memory 250 may be improved.

Figure 9:
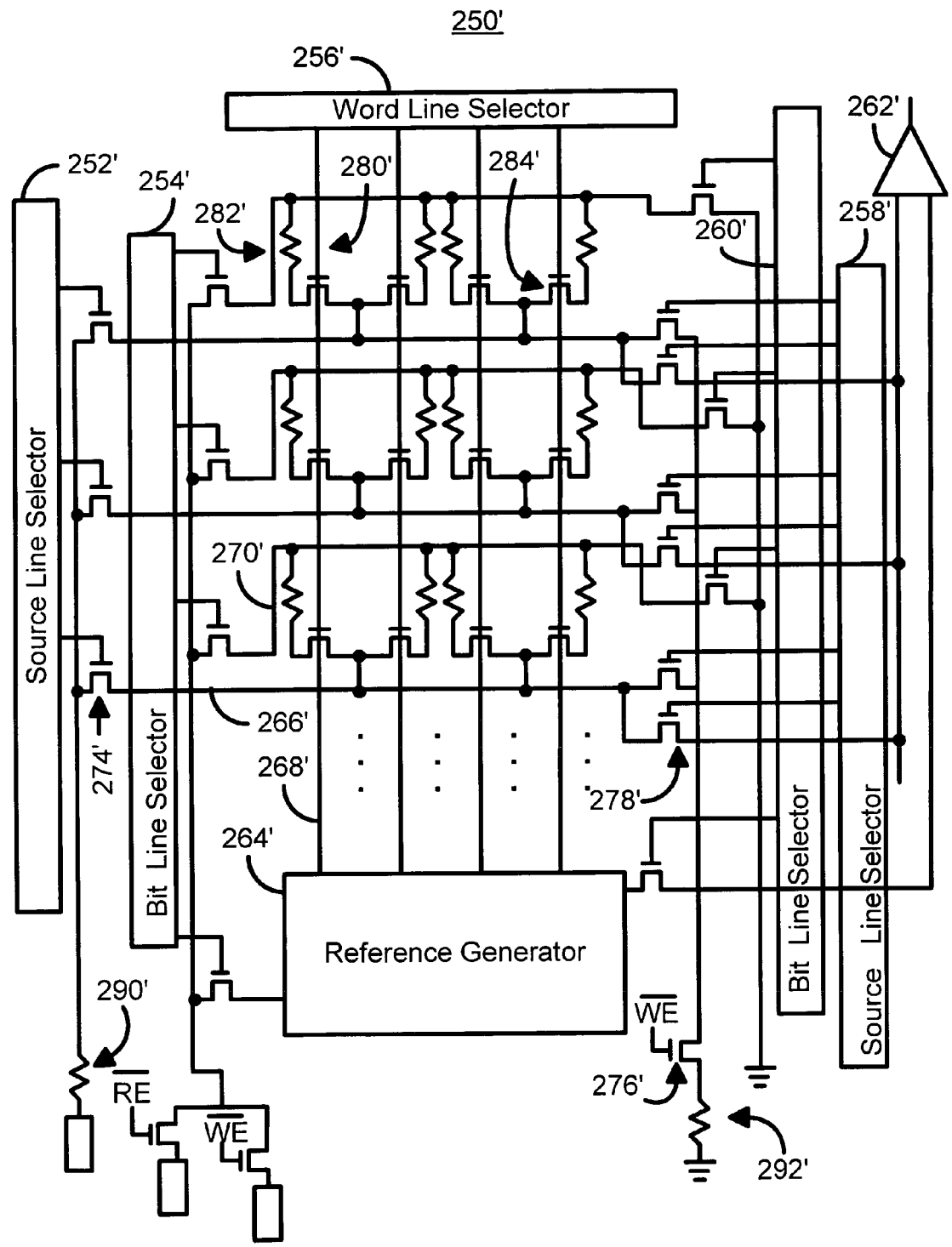
FIG. 9 is a diagram of another embodiment of a portion of a magnetic memory in accordance with the present invention utilizing spin transfer in switching and having parallel source lines and bit lines.

FIG. 9 is a diagram of another embodiment of a portion of a magnetic memory 250' in accordance with the present invention utilizing spin transfer in switching and having parallel source lines and bit lines. The magnetic memory 250' is analogous to the magnetic memory 250. Consequently, analogous components are labeled similarly. Thus, the magnetic memory 250' includes magnetic storage cells 280' having a magnetic element 282' and a selection device 284', source line selectors 252' and 258', bit line selectors 254' and 260', word line selector 256', bit lines 270', reference generator 264', shared source lines 266', word lines 268', switches 274' and 276' that are preferably transistors, output amplifier 262', dummy resistors 290' and 292', and circuitry 278'. Note that in the magnetic memory 250', the source lines 266' are shared between two magnetic storage cells 260'.

The magnetic memory 250' is thus analogous to the magnetic memory 250, except that the source lines 266' are shared by two memory cells. Operation of the magnetic memory 250' is analogous to the magnetic memory 250. Thus, the magnetic memory 250' may have better balanced write currents $I_1$ and $I_2$. The magnetic storage cells 280' may also have improved reliability and endurance. Moreover, use of the dummy resistor(s) 290' and 292' may not affect the read operation. Consequently, performance of the magnetic memory 250' may be improved.

Figure 10:
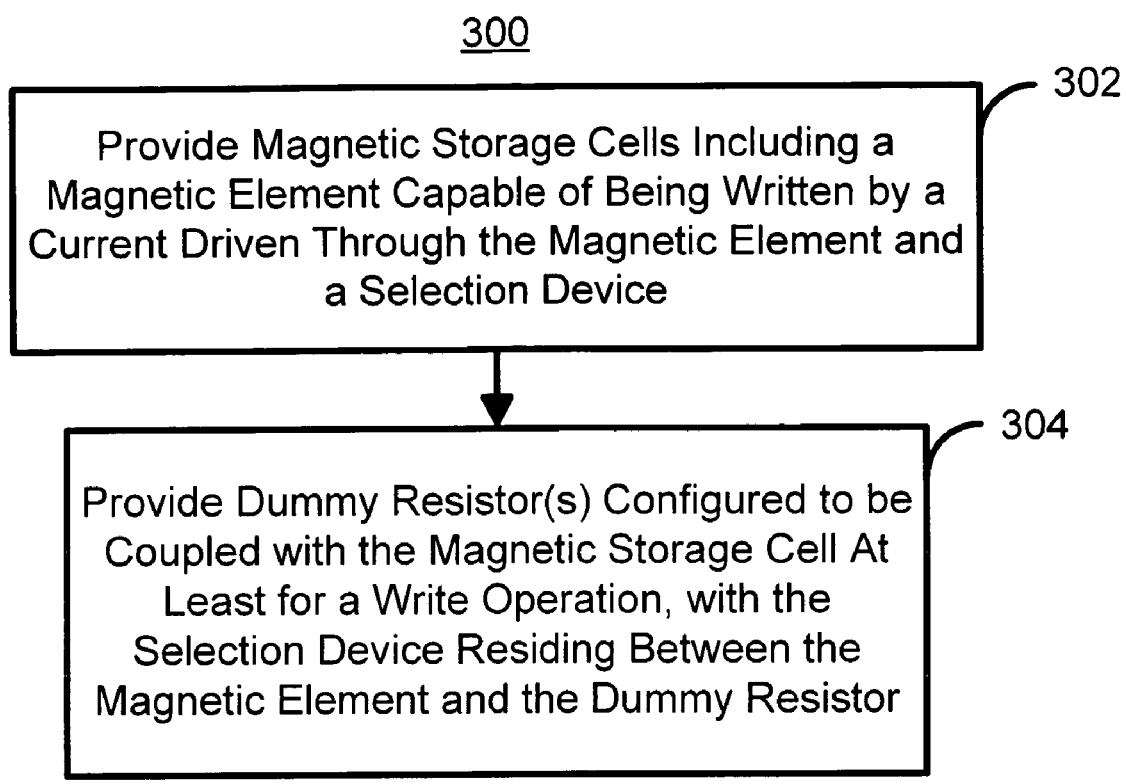
FIG. 10 is a flow-chart depicting one embodiment of a method for providing a magnetic memory in accordance with the present invention.

FIG. 10 is a flow-chart depicting one embodiment of a method 300 for providing a magnetic memory in accordance with the present invention. The method 300 is described in the context of the magnetic memory 100. However, one of ordinary skill in the art will readily recognize that the method 100 can be used with other magnetic memories including but not limited to the magnetic memories 200, 200', 250, and 250'. The magnetic storage cell 110 is provided, via step 302. The magnetic storage cell 110 provided includes the magnetic element 112 capable of being written by driving a current through the magnetic element 112 and using the selection device 114 coupled with the magnetic element 112. The magnetic element 112 is programmed by the first write current driven through the magnetic element 112 in the first direction and the second write current driven through the magnetic element 112 in the second direction. The dummy resistor(s) 130 are provided, via step 304. The dummy resistor(s) 130 are provided such that the dummy resistor(s) 130 are capable of being coupled with the magnetic storage cell 110 at least for a write operation. The selection device 114 is located between the magnetic element 112 and at least one dummy resistor 130.

Thus, using the method 300, at least portion of the magnetic memories 100, 200, 200', 250, and 250' may be provided. Consequently, the benefits of the magnetic memories 100, 200, 200', 250, and 250' may be achieved.

Thus, magnetic memories 100, 200, 200', 250, and 250' and the methods 100 and 300 may be written using a more localize phenomenon that avoids inadvertent writing during programming. Furthermore, the magnetic memories 100, 200, 200', 250, and 250' and the methods 100 and 300 may allow for more balanced write currents and improved reliability without adversely affecting reading. Consequently, performance of the magnetic memories 100, 200, 200', 250, and 250' may be improved.

A method and system for providing and using a magnetic memory having an improved read and write margins has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
   at least one magnetic storage cell, each of the at least one magnetic storage cell including a magnetic element and a selection device coupled with the magnetic element, the magnetic element being programmed by a first write current driven through the magnetic element in a first direction and a second write current driven through the magnetic element in a second direction; and
   at least one dummy resistor capable of being coupled with the at least one magnetic storage cell at least for a write operation of the at least one magnetic storage cell, the selection device being coupled between the magnetic element and the at least one dummy resistor.

2. The magnetic memory of claim 1 wherein the selection device is a transistor having a source side.

3. The magnetic memory of claim 2 wherein the at least one dummy resistor is coupled to the source side of the selection device for at least one of the first write current and the second write current.

4. The magnetic memory of claim 1 wherein magnetic element has a first resistance and a second resistance higher than the first resistance, and wherein each of the at least one dummy resistor has a third resistance of 0.5 to 1.5 of the first resistance.

5. The magnetic memory of claim 4 wherein the third resistance of 0.8 to 1.15 of the first resistance.

6. The magnetic memory of claim 1 wherein the at least one dummy resistor is configured to provide a particular ratio between the first current and the second current.

7. The magnetic memory of claim 6 wherein the particular ratio is substantially one.

8. The magnetic memory of claim 1 wherein the dummy resistor is configured to be selectively coupled to or decoupled from the at least one magnetic storage cell.

9. The magnetic memory of claim 8 wherein the wherein the at least one dummy resistor is configured to be coupled with the at least one magnetic storage cell during a write operation of the magnetic storage cell and decoupled from the at least one magnetic storage cell during a read operation of the magnetic storage cell.

10. A magnetic memory comprising:
    a plurality of magnetic storage cells, each of the plurality of magnetic storage cells including a magnetic element and a selection device coupled with the magnetic element, the magnetic element being programmed by a first write current driven through the magnetic element in a first direction and a second write current driven through the magnetic element in a second direction;

at least one source line corresponding to the plurality of magnetic storage cells, each of the at least one source line being coupled to the selection device of a first portion of the plurality of magnetic storage cells;

at least one bit line corresponding to the plurality of magnetic storage cells, each of the at least one source line being coupled to the selection device of a first portion of the plurality of magnetic storage cells;

a plurality of dummy resistors configured to be selectively coupled with the plurality of magnetic storage cells through the at least one source line or the at least one bit line at least for a write operation of the at least one magnetic storage cell, the selection device being coupled between the magnetic element and the plurality of dummy resistors.

11. The magnetic memory of claim 10 further comprising:
Bypass circuitry coupled with the at least one source line or the at least one bit line, the bypass circuitry configured to bypass the plurality of dummy resistors.

12. The magnetic memory of claim 11 wherein the bypass circuitry is configured to bypass the plurality of dummy resistors during a read operation.

13. The magnetic memory of claim 10 wherein the selection device is a transistor having a source side.

14. The magnetic memory of claim 13 wherein the plurality of dummy resistors is configured to be coupled on the source side of the selection device for the plurality of magnetic storage cells at least during the write operation of the at least one magnetic storage cell.

15. The magnetic memory of claim 13 wherein the plurality of dummy resistors is configured to be selectively coupled to or decoupled form the source side of the selection device for the plurality of magnetic storage cells.

16. The magnetic memory of claim 10 wherein magnetic element has a first resistance and a second resistance higher than the first resistance, and wherein each of the plurality of dummy resistors has a third resistance of 0.5 to 1.5 of the first resistance.

17. The magnetic memory of claim 16 wherein the third resistance of 0.8 to 1.15 of the first resistance.

18. The magnetic memory of claim 10 wherein the at least one dummy resistor is configured to provide a particular ratio between the first current and the second current.

19. The magnetic memory of claim 18 wherein the particular ratio is substantially one.

20. A method for utilizing a magnetic memory including a plurality of magnetic storage cells, at least one source line corresponding to the plurality of magnetic storage cells, and at least one bit line corresponding to the plurality of magnetic storage cells, each of the plurality of magnetic storage cells including a magnetic element and a selection device coupled with the magnetic element, the magnetic element being programmed by a first write current driven through the magnetic element in a first direction and a second write current driven through the magnetic element in a second direction, each of the at least one source line being coupled to the selection device of a first portion of the plurality of magnetic storage cells, each of the at least one source line being coupled to the selection device of a first portion of the plurality of magnetic storage cells, the method comprising:

selectively coupling at least one dummy resistor with a portion of the plurality of magnetic storage cells through the at least one source line or the at least one bit line at least for a write operation, the selection device being coupled between the magnetic element and the at least one dummy resistor;

driving the first write current or the second write current through the portion of the plurality of magnetic storage cells.

21. The method of claim 20 wherein the selection device is a transistor having a source side and wherein the selectively coupling further includes selectively coupling or decoupling the at least one dummy resistor on the source side of the selection device.

22. The method of claim 20 further comprising:
ensuring that the at least one dummy resistor is electrically decoupled from another portion of the plurality of magnetic storage cells during reading of the another portion of the plurality of magnetic storage cells.

23. The method of claim 20 wherein magnetic element has a first resistance and a second resistance higher than the first resistance, and wherein each of the at least one dummy resistor has a third resistance of 0.5 to 1.5 of the first resistance.

24. The method of claim 23 wherein the third resistance of 0.8 to 1.15 of the first resistance.

25. The method of claim 20 wherein the at least one dummy resistor is configured to provide a particular ratio between the first current and the second current.

26. The method of claim 20 wherein the particular ratio is substantially one.

27. A method for providing a magnetic memory comprising:
providing at least one magnetic storage cell, each of the at least one magnetic storage cell including a magnetic element and a selection device coupled with the magnetic element, the magnetic element being programmed by a first write current driven through the magnetic element in a first direction and a second write current driven through the magnetic element in a second direction; and providing at least one dummy resistor capable of being coupled with the at least one magnetic storage cell at least for a write operation of the at least one magnetic storage cell, the selection device being coupled between the magnetic element and the at least one dummy resistor.

28. The method of claim 27 wherein at least one magnetic storage cell providing further includes:
providing the selection device is a transistor having a source side.

29. The method of claim 28 wherein the at least one dummy resistor providing further includes:
providing the dummy resistor capable of being coupled on the source side of the selection device for the first write current and the second write current.

30. The method of claim 27 wherein magnetic element has a first resistance and a second resistance higher than the first resistance, and wherein each of the at least one dummy resistor has a third resistance of 0.5 to 1.5 of the first resistance.

31. The method of claim 30 wherein the third resistance of 0.8 to 1.15 of the first resistance.

32. The method of claim 27 wherein the at least one dummy resistor is configured to provide a particular ratio between the first current and the second current.

33. The method of claim 27 wherein the particular ratio is substantially one.

34. The method of claim 27 wherein the at least one dummy resistor providing further includes:
   configuring the at least one dummy resistor to be selectively coupled with or decoupled from the at least one magnetic storage cell.

35. The method of claim 34 wherein the at least one dummy resistor configuring further includes:
   configuring the at least one dummy resistor to be selectively coupled with or decoupled from the at least one magnetic storage cell during a write operation.

36. The method of claim 34 wherein the at least one dummy resistor configuring further includes:
   configuring the at least one dummy resistor to be selectively coupled with the at least one magnetic storage cell during a write operation of the magnetic storage cell and decoupled from the at least one magnetic storage cell during a read operation of the magnetic storage cell.

\* \* \* \* \*